United States Patent
Wu

(10) Patent No.: US 9,659,643 B2
(45) Date of Patent: May 23, 2017

(54) OPERATION METHOD FOR RRAM

(71) Applicant: WINBOND ELECTRONICS CORP., Taichung (TW)

(72) Inventor: Chien-Min Wu, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/040,456

(22) Filed: Feb. 10, 2016

(65) Prior Publication Data

US 2016/0260480 A1    Sep. 8, 2016

(30) Foreign Application Priority Data

Mar. 3, 2015  (TW) .............................. 104106601 A

(51) Int. Cl.
   *G11C 13/00*  (2006.01)
(52) U.S. Cl.
   CPC ...... *G11C 13/0064* (2013.01); *G11C 13/0002* (2013.01); *G11C 13/004* (2013.01); *G11C 13/0023* (2013.01); *G11C 13/0069* (2013.01); *G11C 13/0097* (2013.01); *G11C 13/0061* (2013.01); *G11C 2013/0052* (2013.01); *G11C 2013/0073* (2013.01)

(58) Field of Classification Search
   USPC ........................................................ 365/148
   See application file for complete search history.

(56) References Cited

U.S. PATENT DOCUMENTS

| 8,599,600 | B2 | 12/2013 | Xi et al. |
| 9,001,553 | B1* | 4/2015 | Kamalanathan ... G11C 13/0004 365/148 |
| 2009/0207652 | A1* | 8/2009 | Nitta .................... G11C 11/5678 365/163 |
| 2010/0232199 | A1* | 9/2010 | Maejima .................. G11C 8/08 365/51 |
| 2012/0147658 | A1 | 6/2012 | Kim et al. |
| 2014/0056054 | A1 | 2/2014 | Kim et al. |
| 2014/0254237 | A1 | 9/2014 | Chang et al. |

* cited by examiner

*Primary Examiner* — Hoai V Ho
*Assistant Examiner* — Minh Dinh
(74) *Attorney, Agent, or Firm* — Muncy, Geissler, Olds & Lowe, P.C.

(57) ABSTRACT

The present invention provides an operation method for RRAM. The operation method includes providing a reset voltage pulse to a RRAM, providing a dummy voltage pulse to the RRAM, and providing a verification voltage pulse to the RRAM. The reset current of the RRAM is read when the verification voltage pulse is provided. The voltage level of the verification voltage pulse is higher than the voltage level of the read voltage pulse for reading the RRAM.

6 Claims, 10 Drawing Sheets

OPERATION METHOD FOR RRAM

CROSS REFERENCE TO RELATED APPLICATIONS

This Application claims priority of Taiwan Patent Application No. 104106601 filed on Mar. 3, 2015, the entirety of which is incorporated by reference herein.

BACKGROUND OF THE INVENTION

Field of the Invention

The disclosure generally relates to an operation method for RRAM (Resistive Random Access Memory), and more particularly, to an operation method for improving the reading accuracy of the RRAM.

Description of the Related Art

Memories can be divided into two main types: volatile memory and non-volatile memory. Among the non-volatile memory, flash memory is widely utilized. However, flash memory has some disadvantages, which include its high operating voltage, low operating speed, and low reliability. Regarding advanced research into memory, RRAM is one of the most widely-researched subjects. RRAM has many advantages, such as its simple structure, low operating voltage, high operating speed, multi-bit memory, high reliability, small element area, non-damaging reading, and low cost.

Although the programming voltage pulse of the RRAM is about 20 ns during the setting state, and it is about 50 ns during the reset state, the distribution of the value of resistances of the RRAM is very wide. In order to effectively control the value of resistance, a read verification is needed between the programming voltage pulses. Because of the diffusion of oxygen between traps and the effect of tightening and loosing, the reading of RRAM is not stable, which results in reading errors. FIG. 1A is a schematic diagram of the reset current (Ireset) and the reading number. FIG. 1B is a schematic diagram illustrating the first reset current and the second reset current. The predetermined current is assumed to be 1 uA. When the reset current is greater than the predetermined current, this indicates that the verification has failed. Regarding FIG. 1A, the verification of the first bit fails after it is read the second time, and the second bit and the third bit are verified successfully. In addition, FIG. 1B illustrates that the correlation coefficient R of the first reset current and the second reset current is 0.92. Specifically, most of the first reset currents are smaller than 1 uA, but some second reset currents are greater than 1 uA. Therefore, the reset current is not stable and has a wide distribution.

Therefore, an operation method of RRAM is needed to decrease the number of verification failures when reading, and improving the stability of reading.

BRIEF SUMMARY OF THE INVENTION

In one aspect of the invention, an operation method for RRAM is provided. The operation method includes providing a reset voltage pulse to a RRAM, providing a dummy voltage pulse to the RRAM, and providing a verification voltage pulse to the RRAM. The reset current of the RRAM is read when the verification voltage pulse is provided. The voltage level of the verification voltage pulse is higher than the voltage level of the read voltage pulse for reading the RRAM.

In another aspect of the invention, a first side of the RRAM connects to a bit line, and the reset voltage pulse, the dummy voltage pulse, and the verification voltage pulse are input to the bit line. The second side of the RRAM connects a word line, and the first side is different from the second side. In addition, the RRAM includes a transistor and a resistor. The gate of the transistor connects to the second side; the drain or source of the transistor connects to the first side; and the resistor connects to the first side.

In another embodiment, a waiting period is arranged between providing the reset voltage pulse and providing the verification voltage pulse. The voltage level of the dummy voltage pulse is lower than or equal to the voltage level of the verification voltage pulse. In addition, the operation method includes determining whether the reset current is smaller than or equal to a predetermined current value, determining that verification is successful when the reset current is smaller than the predetermined current value, and determining that verification fails when the reset current is greater than the predetermined current value.

Another aspect of the invention provides an operation method for the RRAM. The operation method includes providing a reset voltage pulse to the RRAM; providing a verification voltage pulse to the RRAM, and reading the current of the RRAM when a verification voltage pulse is provided. The voltage level of the verification voltage pulse is higher than a voltage level for providing a reading voltage pulse to read the RRAM, and a waiting period is provided between providing the reset voltage pulse and providing the verification voltage pulse.

Other aspects and features of the present invention will become apparent to those with ordinarily skill in the art upon review of the following descriptions of specific embodiments of the operation method for RRAM.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless other-

DETAILED DESCRIPTION OF THE INVENTION

Figure 1A:
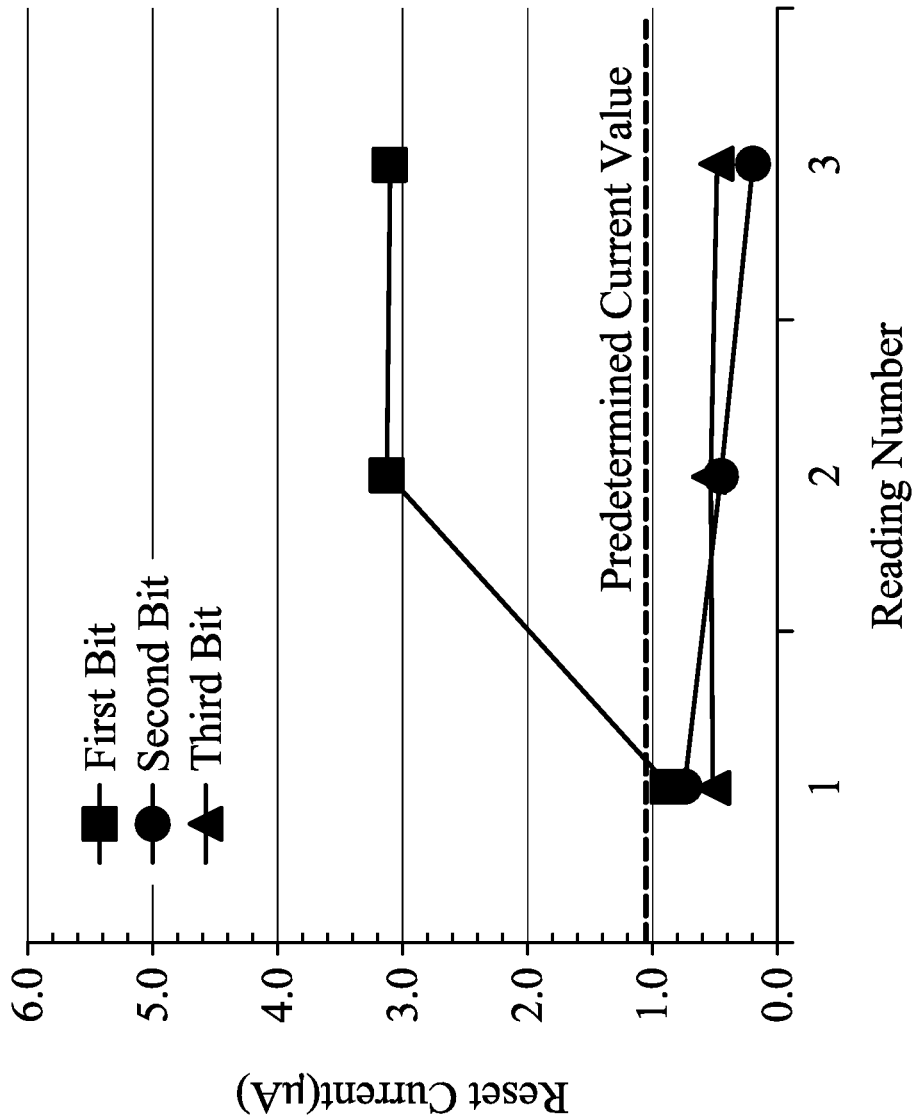
FIG. 1A is a schematic diagram of the reset current (Ireset) and the reading number.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
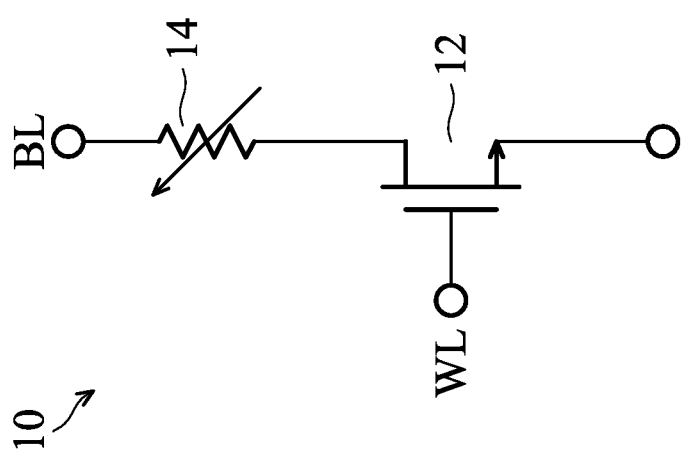
FIG. 2 is a schematic diagram illustrating the RRAM of the present invention.

FIG. 2 is a schematic diagram illustrating the RRAM (Resistive Random Access Memory) 10 of the present invention. In one embodiment, the RRAM 10 includes a transistor 12 and a resistor 14. For example, the resistance of resistor 14 is adjustable. As shown in FIG. 2, the drain (the first side) of the transistor 12 connects the resistor 14 and the bit line BL. In other words, the resistor 14 is arranged between the bit line BL and the drain of the transistor 12. The gate (the second side) of the transistor 12 connects to the word line WL. In addition, the source (which could also be the first side) of the transistor 12 could connect the resistor 14 and the bit line BL. In other words, the resistor 14 is arranged between the bit line BL and the source of the transistor 12, but it is not limited to this configuration by the present invention.

Figure 3:
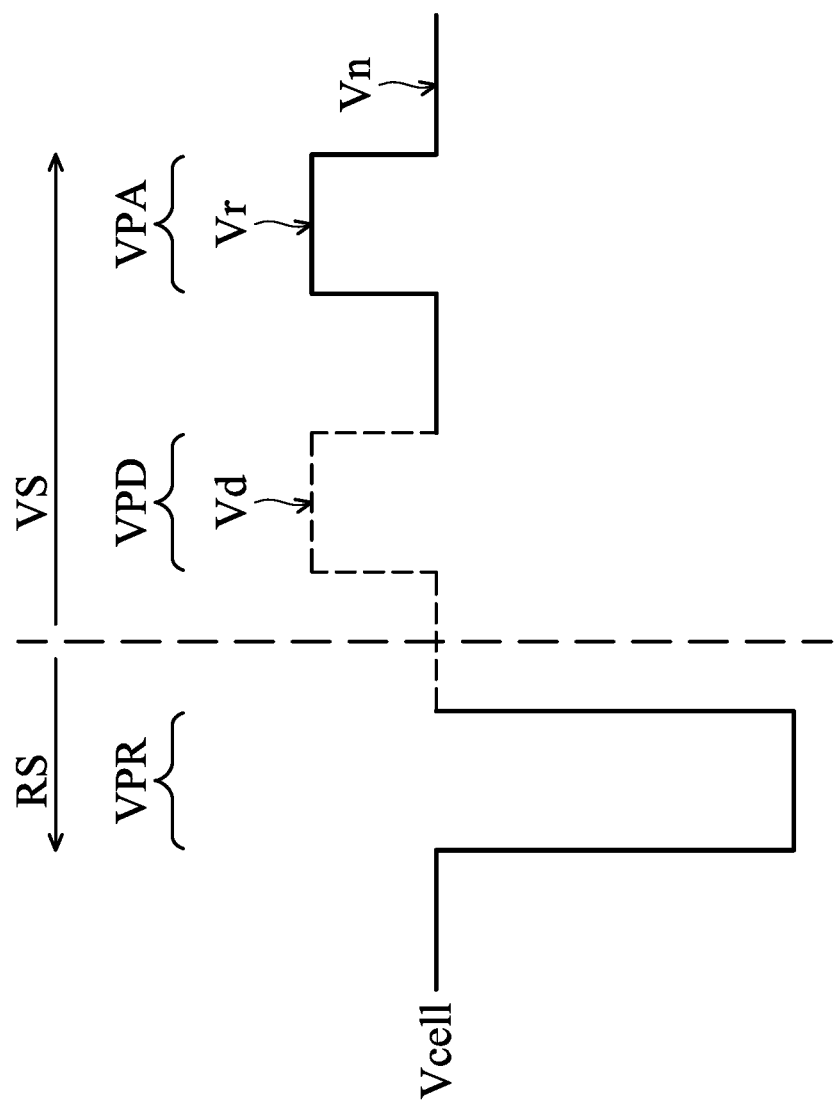
FIG. 3 is a schematic diagram illustrating the voltage pulse of RRAM of the present invention.

FIG. 3 is a schematic diagram illustrating the voltage pulse Vcell of RRAM 10 of the present invention. In order to effectively control the resistance value of the RRAM 10, the verification voltage pulse is arranged between the setting voltage pulse and the reset voltage pulse for the read verification. Accordingly, the voltage pulse Vcell includes the reset stage RS and the verification stage VS. In one embodiment, a reset voltage pulse VPR is provided to the RRAM 10 in the reset stage RS. Afterwards, a dummy voltage pulse VPD is provided to the RRAM 10 in the verification stage VS. Afterwards, a verification voltage pulse VPA is provided to the RRAM 10. It should be noted that the reset voltage pulse VPR, the dummy voltage pulse VPD, and the verification voltage pulse VPA of the voltage pulse Vcell are provided to the bit line BL to drive the RRAM 10. In another embodiment, the reset voltage pulse VPR, the dummy voltage pulse VPD, and the verification voltage pulse VPA of the voltage pulse Vcell are provided to the source line SL to drive the RRAM 10. The source line SL connects to the source of the transistor 12. In addition, in another embodiment, the verification stage VS of the voltage pulse Vcell merely includes the verification voltage pulse VPA, and does not include the dummy voltage pulse before the verification voltage pulse VPA. Similarly, the reset voltage pulse VPR and the verification voltage pulse VPA of the voltage pulse Vcell are provided to the bit line BL to drive the RRAM 10. In another embodiment, the reset voltage pulse VPR and the verification voltage pulse VPA of the voltage pulse Vcell are provided to the source line SL to drive the RRAM 10, and the source line SL connects to the source of the transistor 12.

It should be noted that, when providing the verification voltage pulse VPA, the reset current Ireset of the RRAM 10 will be read. Specifically, When the bit line BL provides the dummy voltage pulse VPD to the RRAM 10, it is not necessary to read the reset current of the RRAM 10. Afterwards, when the bit line BL provides a verification voltage pulse VPA to the RRAM 10, the reset current of the RRAM 10 needs to be read. Since the polarity of the dummy voltage pulse is the same as the polarity of the reading voltage pulse, providing the dummy voltage pulse contributes to shaping the electrical field of the RRAM 10. Therefore, providing the verification voltage pulse after providing the dummy voltage pulse can improve the stability of the RRAM and also decrease the number of reading errors.

In one embodiment, the voltage level Vr of the verification voltage pulse VPA is greater than the reading voltage pulse to read a voltage level Vn of the RRAM 10. As shown in FIG. 3, the voltage level Vr of the verification voltage pulse VPA is greater than the voltage level Vn of the reading voltage pulse. For example, the voltage level Vr of the verification voltage pulse VPA is about 0.4V, and the voltage level Vn of the reading voltage pulse is about 0.2V. The voltage level of the voltage pulse provided by the word line WL is about 3V. Although the voltage level of the verification voltage pulse VPA is greater than the voltage level Vn of the reading voltage pulse, the voltage level Vr of the verification voltage pulse VPA is not greater than the voltage level for setting the RRAM 10. Accordingly, the RRAM 10 is prevented from entering the setting state. Regarding the reading stability of the RRAM 10, decreasing the resent current can decrease the number of reading errors. Therefore, the resistance value of the RRAM 10 should be increased as much as possible. However, in this case, the current could become too low to be detected and it becomes more complicated for circuit design. Therefore, increasing the voltage level Vr of the verification voltage pulse VPA contributes to increasing the sensing current, increasing the operating speed of the RRAM 10, and decreasing the number of reading errors. Furthermore, in another embodiment, the voltage level Vd of the dummy voltage pulse VPD is lower than or equal to the voltage level Vn of the verification voltage pulse VPA.

In another embodiment, there is a waiting period between the provided reset voltage pulse VPR and the provided verification voltage pulse VPA. In other words, when resetting the RRAM 10, the verification voltage pulse VPA is added, and the reset current is read after the waiting period. The verification voltage pulse VPA is not added immediately and the reset current is not read immediately. For example, the waiting period is about one minute. Regarding the RRAM 10, the oxygen atom and the release of vacancy result in instability of the RRAM 10. During the waiting period, the oxygen atoms and the vacancy could be redistributed to reach a stable state. Therefore, arranging a waiting period between the reset voltage pulse VPR and the verification voltage pulse VPA can improve the stability of the RRAM 10 and reducing the reading error.

Figure 4:
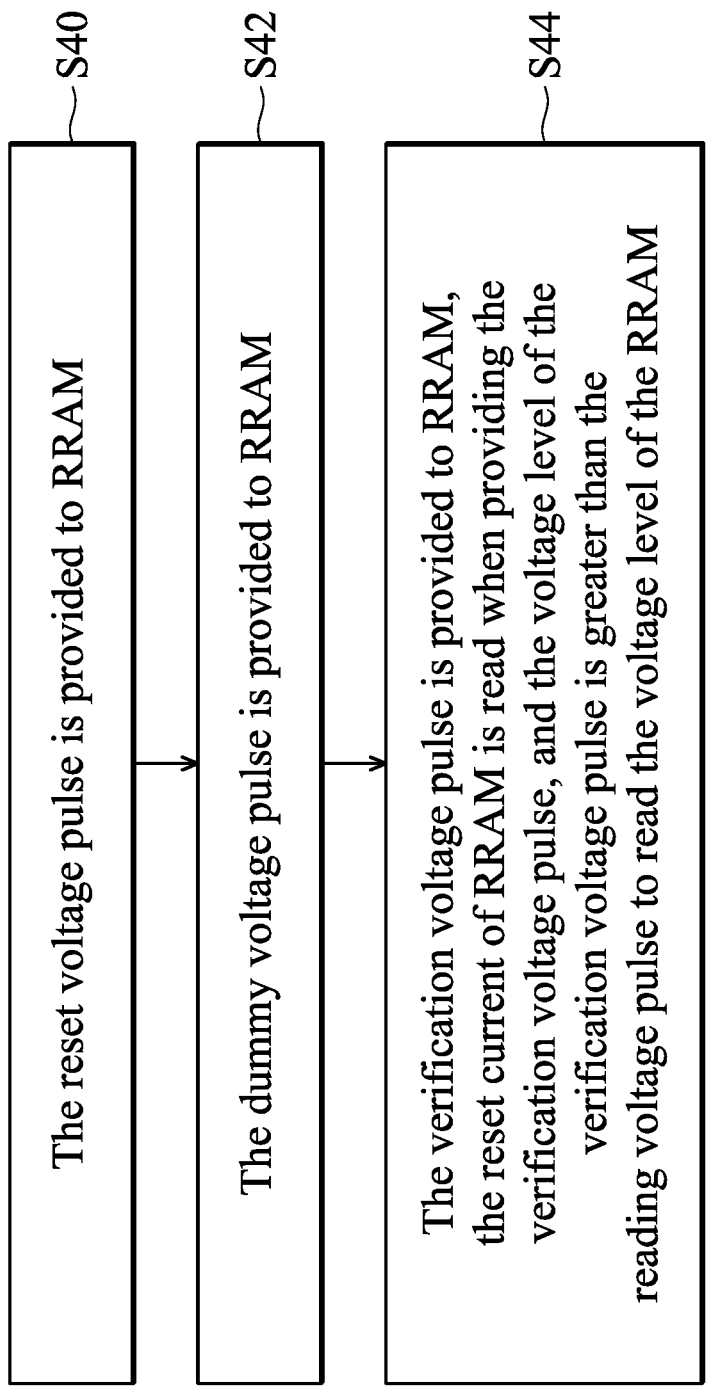
FIG. 4 is a flowchart of the operation method of the RRAM of the present invention.

FIG. 4 is a flowchart of the operation method of the RRAM 10 of the present invention. In step S40, the reset voltage pulse VPR is provided to the RRAM 10. Afterwards, in step S42, the dummy voltage pulse VPD is provided to the RRAM 10. Afterwards, in step S44, the verification voltage pulse VPA is provided to the RRAM 10. It should be noted that the reset current of the RRAM 10 is read when providing the verification voltage pulse VPA. In addition, the voltage level of the verification voltage pulse VPA is greater than the reading voltage pulse to read the voltage level of the RRAM 10.

Figure 5:
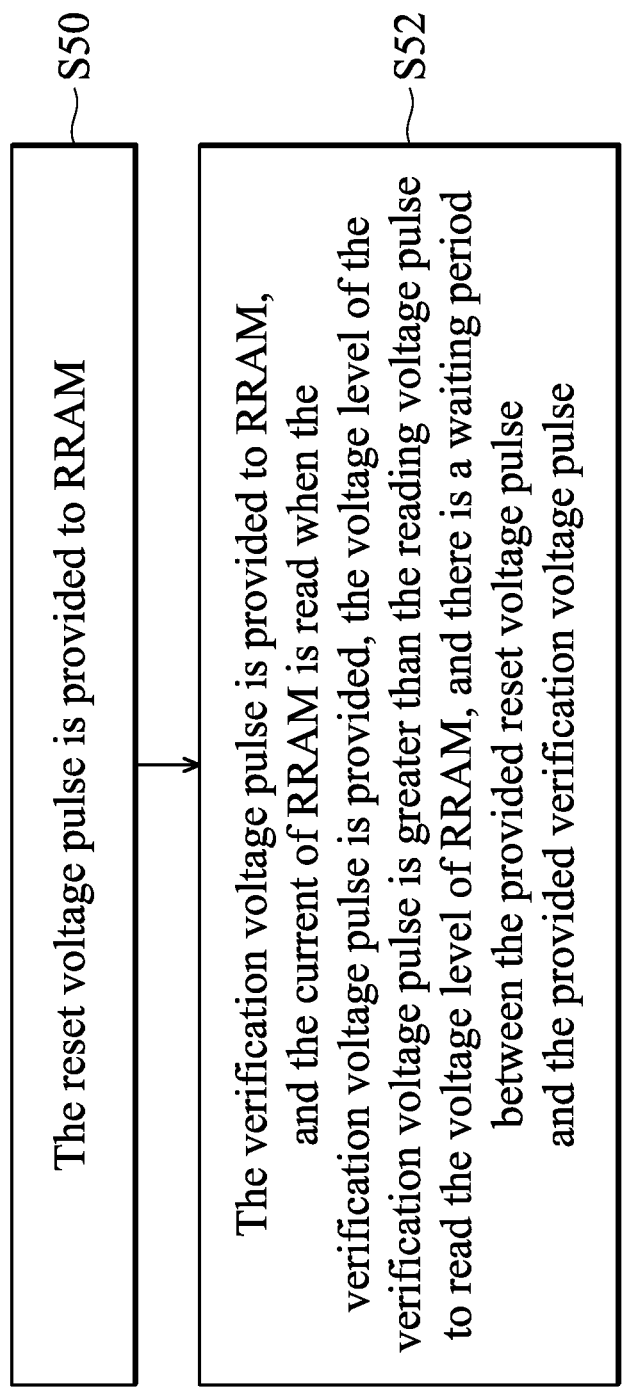
FIG. 5 is another flowchart of the operation method of the RRAM of the present invention.

FIG. 5 is another flowchart of the operation method of the RRAM 10 of the present invention. In step S50, the reset voltage pulse VPR is provided to the RRAM 10. Afterwards, in step S52, the verification voltage pulse VPA is provided to the RRAM 10, and the current of the RRAM 10 is read when the verification voltage pulse VPA is provided. Specifically, the voltage level of the verification voltage pulse VPA is greater than the reading voltage pulse to read the voltage level of the RRAM 10. In addition, there is a waiting period between the provided reset voltage pulse VPR and the provided verification voltage pulse VPA.

Figure 6:
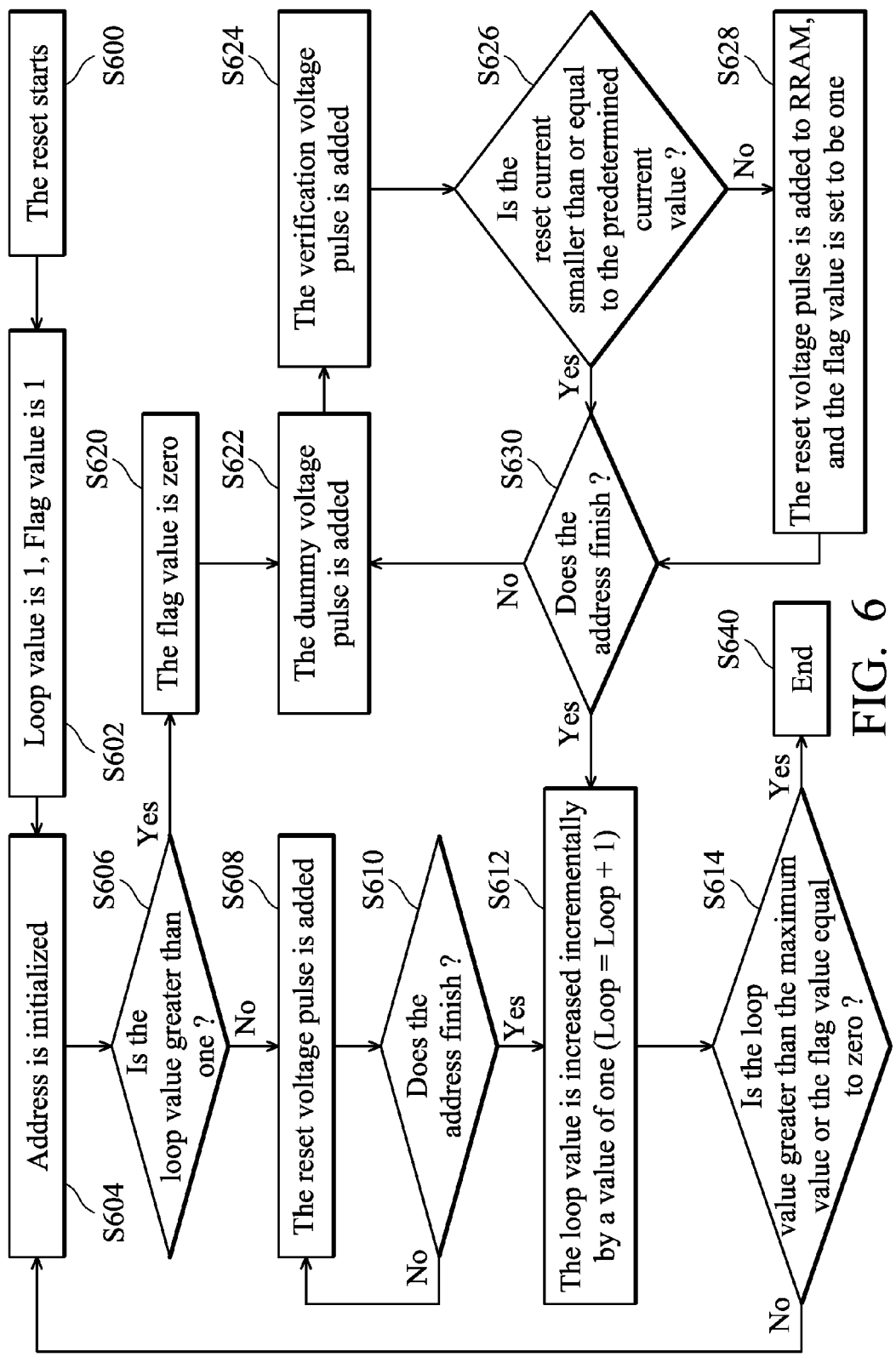
FIG. 6 is another flowchart of the operation method of the RRAM of the present invention.

FIG. 6 is another flowchart of the operation method of the RRAM 10 of the present invention. In one embodiment, the RRAM 10 has a plurality of chips which need reading verifications. In step S600, the reset starts. In step S602, the loop value is 1, and the flag value is 1. Specifically, the loop value indicates which chip is being processed, and the flag value indicates whether the reading verification is executed or not. Afterwards, in step S604, the address is initialized. In other words, the first chip is processed. Afterwards, in step S606, a determination is made about whether or not the loop value is greater than one. If the loop value is greater than one, then step S620 is executed. If the loop value is not greater than one, then step S608 is executed. In step S608, the reset voltage pulse VPR is added to the RRAM 10. Afterwards, in step S610, a determination is made as to whether or not the address finishes or not, which means determining whether or not the last chip is processed. If the address does not finish, step S608 is executed for adding the reset voltage pulse VPR to the RRAM 10. If the address finishes, step S612 is executed. In step S612, the loop value is increased incrementally by a value of one (which means Loop=Loop+1). Afterwards, in step S614, a determination is made as to whether or not the loop value is greater than the maximum value, or if the flag value is equal to zero. If the loop value is not greater than the maximum value, or the flag value is not equal to zero, step S604 is executed. If the loop value is greater than the maximum value, or the flag value is equal to zero, step S640 is executed to finish the process of the operation method.

Furthermore, in step S620, the flag value is zero which indicates that the reading verification will be executed. Afterwards, in step S622, the dummy voltage pulse VPD is added to the RRAM 10. Afterwards, step S624 is executed for adding the verification voltage pulse VPA to the RRAM 10. Afterwards, step S626 is executed to determine whether or not the reset current is smaller than or equal to the predetermined current value. If the reset current is smaller than or equal to the predetermined current value, step S630 will be executed. If the reset current is neither smaller nor equal to the predetermined current value, step S628 will be executed. For example, the predetermined current value could be 1 uA or 2 uA. In other words, the operation method of the present invention determines whether or not the reset current is smaller than or equal to the predetermined current value. If the reset current is smaller the predetermined current value, it is determined that the verification is successful. If the reset current is greater the predetermined current value, it is determined that the verification fails and the reset voltage pulse VPR is provided to the RRAM 10. Therefore, in step S628, the reset voltage pulse VPR is added to the RRAM 10, and the flag value is set to be one for indicating the completion of the verification. Afterwards, in step S630, a determination is made as to whether or not the address finishes, which means determining whether the last chip has been processed or not. When the address does not finish, step S622 will be executed to keep adding the dummy voltage pulse VPD to the RRAM 10. When the address finishes, step S612 will be executed.

It should be noted that in the process flow of the operation method of the RRAM 10, steps S608 and S610 belong to the reset stage RS, and steps S622, S624 and S626 belong to the verification stage VS. In one embodiment, there is a waiting period between executing the steps of reset stage RS and executing the steps of verification stage VS to improve the stability of the RRAM 10. In another embodiment, step S622 could be executed more than two times to add the dummy voltage pulse VPD to further decrease the number of reading errors of the RRAM 10. In addition, the voltage level of the verification voltage pulse VPA is greater than the voltage level of the reading voltage pulse and the voltage level for reading the RRAM 10.

Figure 1B:
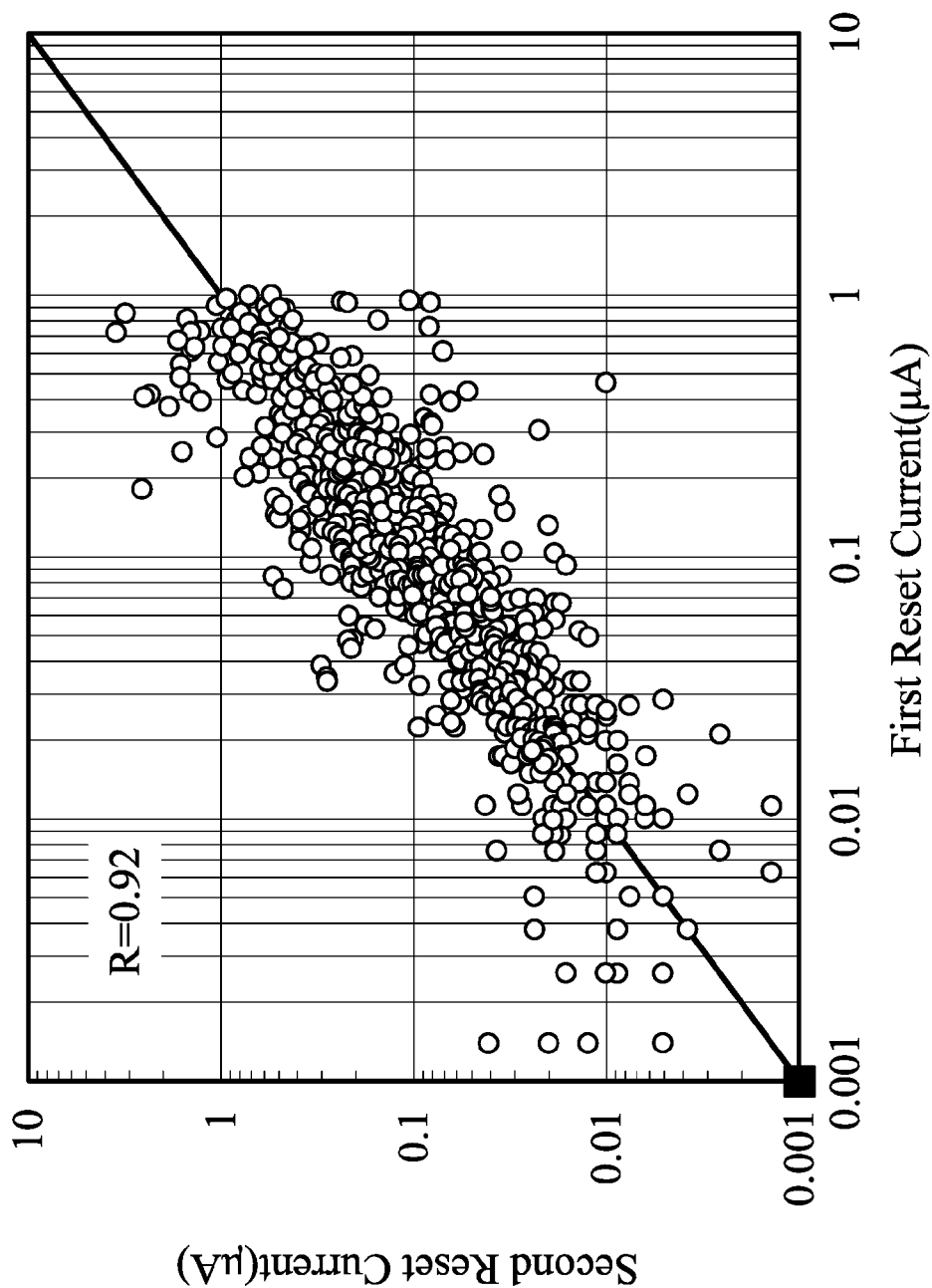
FIG. 1B is a schematic diagram illustrating the first reset current and the second reset current.
Figure 7A:
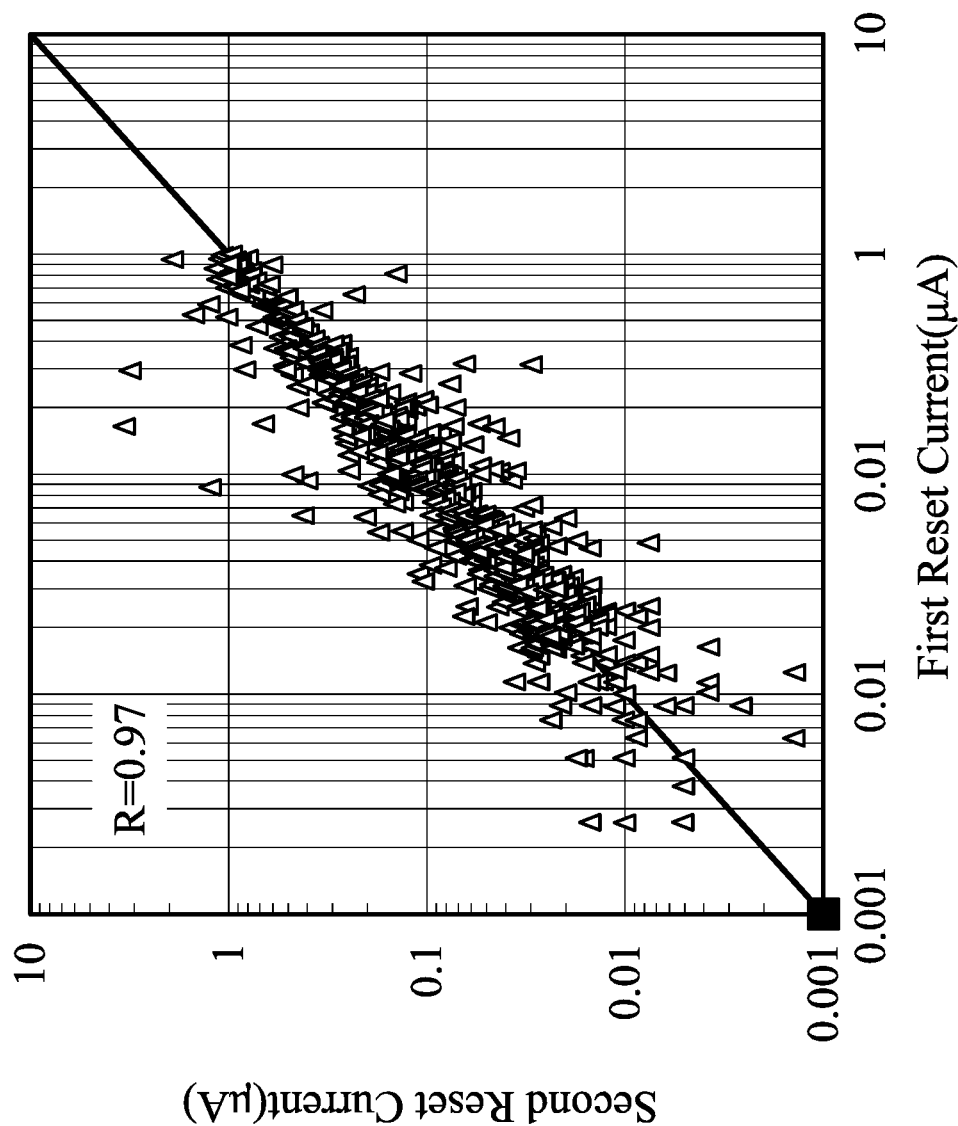
FIG. 7A is a schematic diagram illustrating the first reset current and the second reset current of the RRAM of the present invention.

FIG. 7A is a schematic diagram illustrating the first reset current and the second reset current of the RRAM 10 of the present invention. In the embodiment of FIG. 7A, there is a waiting period between providing the reset voltage pulse VPR and providing the verification voltage pulse VPA. Specifically, the correlation coefficient R between the first reset current and the second reset current is 0.97, which is greater than the correlation coefficient R (R=0.92) of FIG. 1B. Therefore, the waiting period is beneficial for improving the stability of the RRAM 10 so that the first reset current is identical to the second reset current.

Figure 7B:
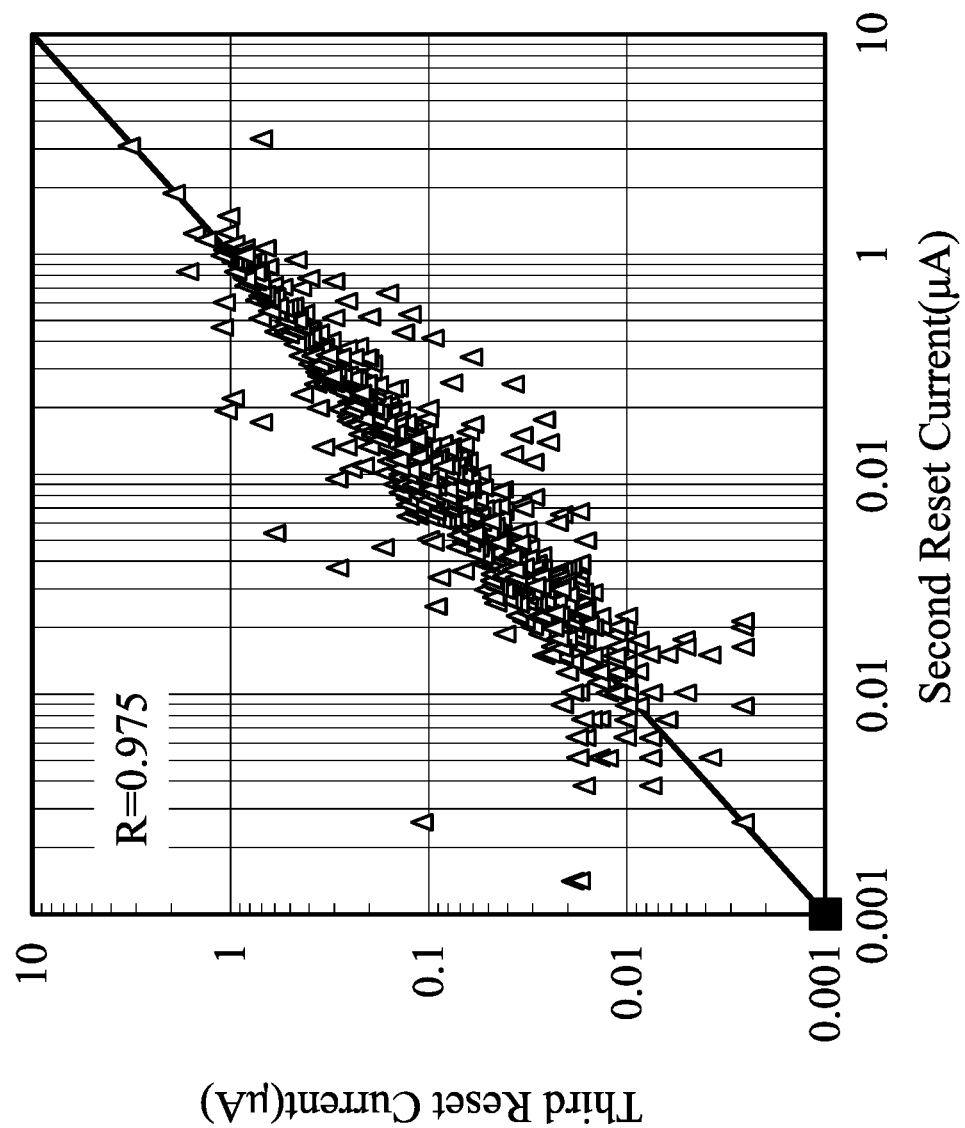
FIG. 7B is a schematic diagram illustrating the second reset current and the third reset current of the RRAM of the present invention.

FIG. 7B is a schematic diagram illustrating the second reset current and the third reset current of the RRAM 10 of the present invention. In the embodiment of FIG. 7B, the dummy voltage pulse VPD is added to the RRAM 10. Specifically, the first reset current is not read when adding the dummy voltage pulse VPD. The second reset current and the third reset current are read when adding the verification voltage pulse VPA. As shown in FIG. 7B, the correlation coefficient R between the second reset current and the third reset current is 0.975, which is greater than the correlation coefficient R (R=0.92) of FIG. 1B. Therefore, providing the dummy voltage pulse VPD to the RRAM 10 is beneficial for improving the stability of the RRAM 10 and decreasing the reading error, such that the second reset current is identical to the third reset current.

Figure 8:
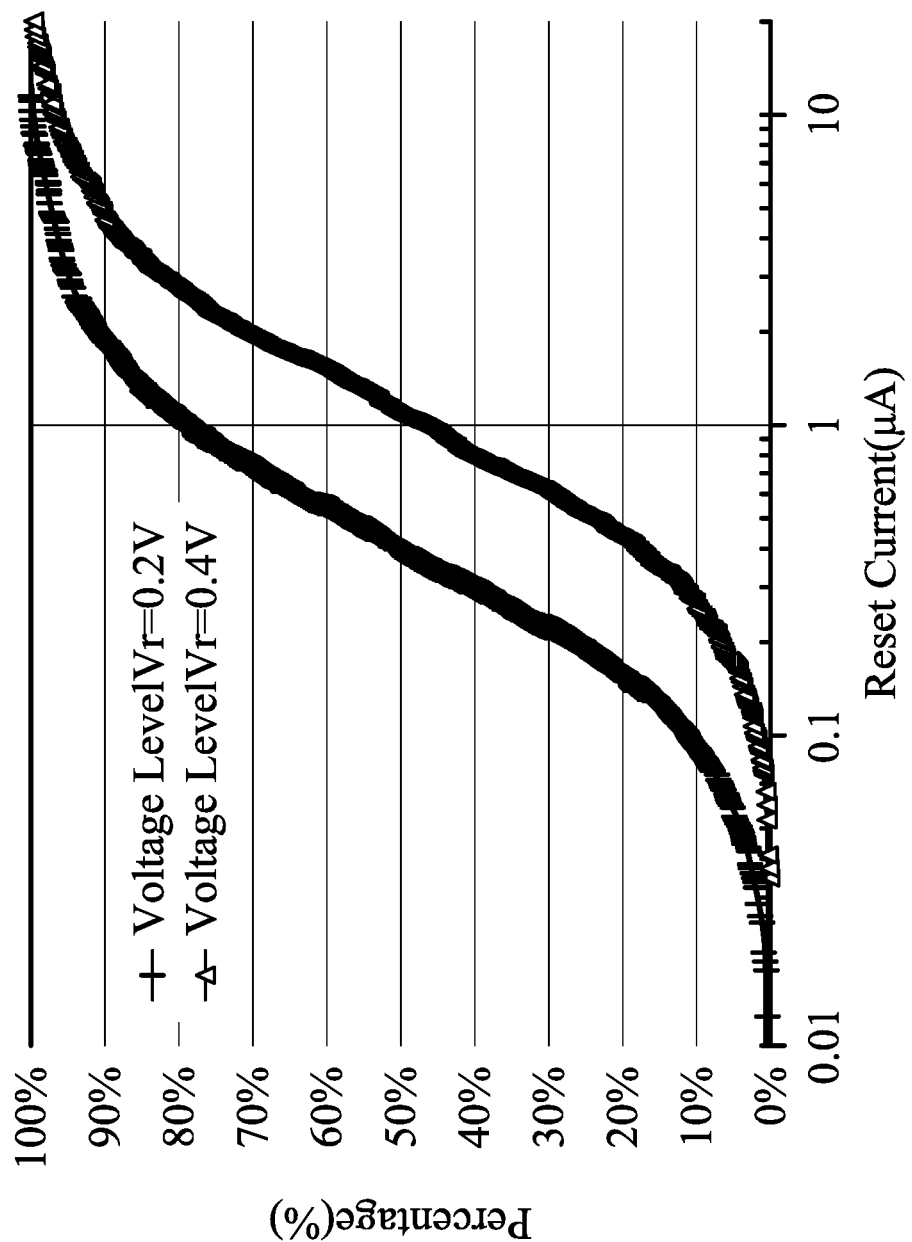
FIG. 8 is a schematic diagram illustrating the reset current and the verification percentage of the RRAM of the present invention.

FIG. 8 is a schematic diagram illustrating the reset current and the verification percentage of the RRAM 10 of the present invention. The two curves of FIG. 8 indicate the reset currents which respond to the respective voltage levels Vr of 0.2V and 0.4V of the verification voltage pulse. FIG. 8 illustrates that the two curves are parallel shifted without changing the shapes or the curvature. When the voltage level Vr of the verification voltage pulse VPA is increased from 0.2V to 0.4V, the characteristics of the RRAM 10 do not change. In addition, regarding the verification percentage of 80%, the values of the reset currents that correspond to the two respective curves are 1 uA and 3 uA. In other words, when the voltage level Vr of the verification voltage pulse VPA is increased from 0.2V to 0.4V, the current which could be detected is also increased. Therefore, increasing the voltage level Vr of the verification voltage pulse VPA is beneficial for increasing the detecting current, reducing the number of reading errors of the RRAM 10, and also improving the operating speed.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements. While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An operation method for a resistive random access memory (RRAM), comprising:
    providing a reset voltage pulse to the RRAM;
    providing a dummy voltage pulse to the RRAM; and
    providing a verification voltage pulse to the RRAM and reading a reset current of the RRAM when the verification voltage pulse is provided, wherein voltage level of the verification voltage pulse is higher than a voltage level for providing a reading voltage pulse to read the RRAM, and voltage level of the dummy voltage pulse is lower than or equal to voltage level of the verification voltage pulse.

2. The operation method for the RRAM as claimed in claim 1, wherein a first side of the RRAM connects to a bit line, and the reset voltage pulse, the dummy voltage pulse, and the verification voltage pulse are input to the bit line.

3. The operation method for the RRAM as claimed in claim 1, wherein a waiting period is arranged between providing the reset voltage pulse and providing the verification voltage pulse.

4. An operation method for a resistive random access memory (RRAM), comprising:
    providing a reset voltage pulse to the RRAM;
    providing a dummy voltage pulse to the RRAM;
    providing a verification voltage pulse to the RRAM and reading current of the RRAM when the verification voltage pulse is provided, wherein voltage level of the verification voltage pulse is higher than a voltage level for providing a reading voltage pulse to read the RRAM, and a waiting period is provided between providing the reset voltage pulse and providing the verification voltage pulse, and voltage level of the dummy voltage pulse is lower than or equal to voltage level of the verification voltage pulse.

5. The operation method for the RRAM as claimed in claim 4, wherein a first side of the RRAM connects to a bit line, and the reset voltage pulse, the dummy voltage pulse, and the verification voltage pulse are input to the bit line.

6. The operation method for the RRAM as claimed in claim 4, further comprising determining whether the reset current is smaller than or equal to a predetermined current value, and determining that verification is successful when the reset current is smaller than the predetermined current value.

\* \* \* \* \*